United States Patent
Seki

(10) Patent No.: US 8,648,461 B2
(45) Date of Patent: Feb. 11, 2014

(54) SEMICONDUCTOR DEVICE

(71) Applicant: Shinko Electric Industries Co., Ltd., Nagano-ken (JP)

(72) Inventor: Masafumi Seki, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/661,233

(22) Filed: Oct. 26, 2012

(65) Prior Publication Data
US 2013/0105964 A1    May 2, 2013

(30) Foreign Application Priority Data
Oct. 31, 2011   (JP) ................... 2011-239377

(51) Int. Cl.
*H01L 23/34*    (2006.01)

(52) U.S. Cl.
USPC ........... 257/713; 257/718; 257/719; 257/722; 257/730; 257/732

(58) Field of Classification Search
USPC ........................................... 257/732
See application file for complete search history.

(56) References Cited

U.S. PATENT DOCUMENTS

| | | | | |
|---|---|---|---|---|
| 5,375,652 A | * | 12/1994 | Matsunaga et al. | 165/80.3 |
| 6,093,961 A | * | 7/2000 | McCullough | 257/718 |
| 7,190,586 B2 | * | 3/2007 | Franz et al. | 361/704 |
| 7,564,687 B2 | * | 7/2009 | Liu et al. | 361/704 |
| 2003/0159819 A1 | * | 8/2003 | Lee | 165/185 |

FOREIGN PATENT DOCUMENTS

JP    2009-043978    2/2009

* cited by examiner

*Primary Examiner* — David E Graybill
(74) *Attorney, Agent, or Firm* — Fish & Richardson P.C.

(57) ABSTRACT

A semiconductor device includes a wiring substrate, a semiconductor element mounted on the wiring substrate, a first radiator member arranged on and thermally coupled to the semiconductor element, and a second radiator member arranged on and thermally coupled to the first radiator member. The second radiator member includes projections which project out toward the first radiator member. The projections are formed on a circumference of a concentric circle with respect to a center point of the second radiator member. The first radiator member includes grooves in which the projections are movable. The grooves are formed on a circumference of a concentric circle with respect to a center point of the first radiator member. The projections are fitted to terminating ends of the grooves with the center point of the first radiator member and the center point of the second radiator member coincided.

10 Claims, 9 Drawing Sheets

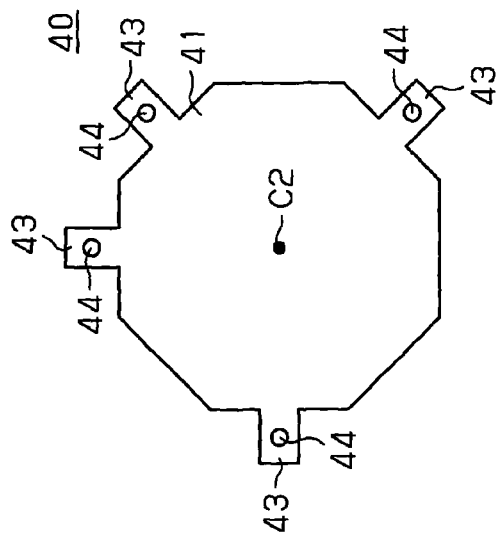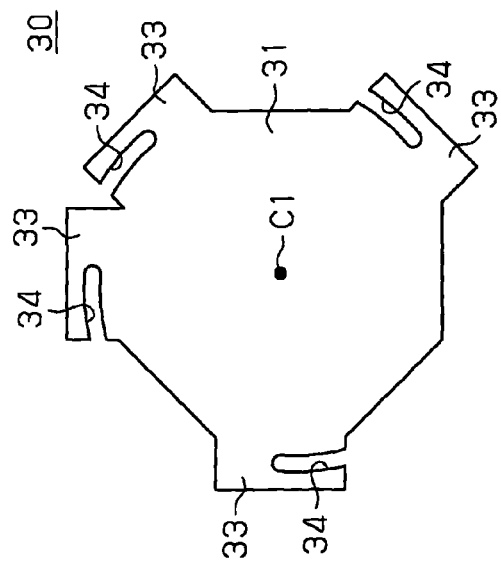

SEMICONDUCTOR DEVICE

CROSS-REFERENCE TO RELATED APPLICATIONS

This application is based upon and claims the benefit of priority from prior Japanese Patent Application No. 2011-239377, filed on Oct. 31, 2011, the entire contents of which are incorporated herein by reference.

FIELD

This disclosure relates to a semiconductor device.

BACKGROUND

In recent years, semiconductor elements used in a CPU (Central Processing Unit), a GPU (Graphics Processing Unit), and the like are becoming more sophisticated and faster. The amount of heat generation of the semiconductor element thus increases. If the temperature of the semiconductor element rises with increase in the amount of heat generation, this may cause lowering in operation speed, breakdown, and the like of the semiconductor element.

Japanese Laid-Open Patent Publication No. 2009-043978 describes a technique of radiating and cooling the semiconductor element to suppress the rise in temperature of the semiconductor element. FIG. 11 illustrates an example of a semiconductor device of the related art. The semiconductor device has a wiring substrate 70, a semiconductor element 71 mounted on the wiring substrate 70, and a radiator plate 72 formed from a higher thermal conductive metal and thermally coupled to the semiconductor element 71. Further, a heat sink 74 with heat radiation fins 73 is thermally coupled to the radiator plate 72. In this case, the heat emitted from the semiconductor element 71 is once diffused to the radiator plate 72, and then radiated to the atmosphere through the heat sink 74. The heat emitted from the semiconductor element 71 is thus efficiently radiated, and the temperature rise of the semiconductor element 71 is suppressed.

However, since the heat sink 74 is fixed to a mounting substrate 75 such as a motherboard, a region for fixing the heat sink 74 needs to be ensured in the mounting substrate 75. This inhibits miniaturization of the entire device. Furthermore, a fixing tool, such as a screw, or an adhesive needs to be used when fixing the heat sink 74 to the mounting substrate 75. This complicates the manufacturing steps and increases the manufacturing cost. Moreover, if warp occurs in the mounting substrate 75 by heat contraction, or the like, a state in which the radiator plate 72 and the heat sink 74 make point contact or line contact may occur. Therefore, sufficient heat conduction may not be carried out from the radiator plate 72 to the heat sink 74.

SUMMARY

One aspect of this disclosure is a semiconductor device including a wiring substrate, a semiconductor element mounted on the wiring substrate, a first radiator member arranged on the semiconductor element and thermally coupled to the semiconductor element, and a second radiator member arranged on the first radiator member and thermally coupled to the first radiator member. The second radiator member includes a plurality of projections which project out toward the first radiator member. The plurality of projections are formed on a circumference of a concentric circle with respect to a center point of the second radiator member when the second radiator member is viewed from above. The first radiator member includes a plurality of grooves in which the plurality of projections are movable. The plurality of grooves are formed on a circumference of a concentric circle with respect to a center point of the first radiator member when the first radiator member is viewed from above. Each of the plurality of grooves includes a terminating end. Each of the plurality of projections is fitted to the terminating end of a corresponding one of the plurality of grooves with the center point of the first radiator member and the center point of the second radiator member coincided.

Other aspects and advantages of the embodiments will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which:

FIG. 10A is a schematic plan view illustrating a modified example of the radiator plate arranged in the semiconductor device of FIG. 1A;

FIG. 10B is a schematic plan view illustrating a modified example of the heat sink arranged in the semiconductor device of FIG. 1A.

DESCRIPTION OF THE EMBODIMENTS

Embodiments will now be described with reference to the accompanying drawings. The accompanying drawings may illustrate the characteristic portion in an enlarged manner for the sake of convenience to facilitate the understanding of the characteristic. The dimensional ratio and the like of each element thus may not necessarily be the same as the actual dimensional ratio and the like.

A semiconductor device 1 of one embodiment will now be described below with reference to FIGS. 1A to 1C, and FIGS. 2A and 2B.

Figure 1A:
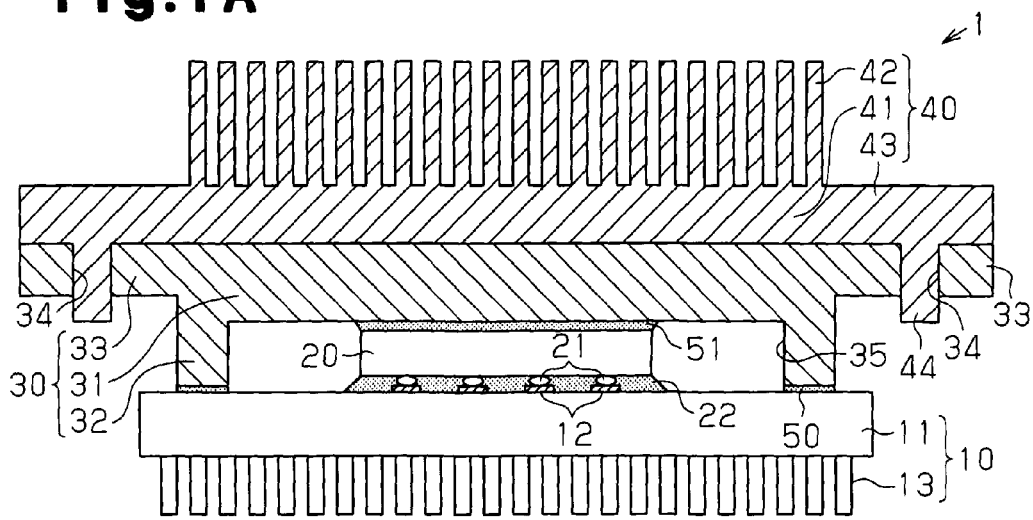
FIG. 1A is a schematic cross-sectional view illustrating a semiconductor device of one embodiment.

As illustrated in FIG. 1A, the semiconductor device 1 includes a PGA (Pin Grid Array) type wiring substrate 10, a semiconductor element 20 mounted on the wiring substrate 10, a radiator plate 30 arranged above the semiconductor element 20, and a heat sink 40 arranged above the radiator plate 30. The radiator plate 30 is an example of a first radiator member, and the heat sink 40 is an example of a second radiator member.

The wiring substrate 10 includes a substrate body 11, connecting pads 12, and pins 13. The substrate body 11 may have an arbitrary structure as long as the connecting pads 12 and the pins 13 are electrically coupled to each other through the inside of the substrate body 11. For example, a wiring layer may be formed inside the substrate body 11. However, as long as the connecting pads 12 and the pins 13 are electrically coupled to each other, a wiring layer may be unnecessary. When a plurality of wiring layers are formed inside the substrate body 11, the wiring layers are stacked with interlayer insulating layers arranged therebetween. In such a structure, the connecting pads 12 and the pins 13 are electrically coupled by the wiring layers and vias formed in the insulating layers. The substrate body 11 may be, for example, a core build-up substrate that includes a core substrate, or a coreless substrate that does not includes a core substrate.

The connecting pads 12 are formed on an upper surface of the substrate body 11. Examples of the material for the connecting pads 12 include copper (Cu) and Cu alloys. The pins 13 are arranged as external connection terminals to be coupled with the mounting substrate such as the motherboard, for example.

The semiconductor element 20 is formed using a thinned semiconductor substrate formed from silicon (Si) or the like. The semiconductor element 20 includes an element forming surface (lower surface as viewed in FIG. 1A) on which a semiconductor integrated circuit (not illustrated) is formed. Connection terminals 21 are arranged on the element forming surface of the semiconductor element 20. The element forming surface is covered with a passivation film excluding the connection terminals 21. As the semiconductor element 20, a logic chip, such as a CPU (Central Processing Unit) chip or a GPU (Graphics Processing Unit) chip, for example, may be used. Further, a memory chip, such as a DRAM (Dynamic Random Access Memory) chip, an SRAM (Static Random Access Memory) chip, or a flash memory chip, for example, may also be used as the semiconductor element 20. The thickness of the semiconductor element 20 may be, for example, 10 to 50 μm.

The semiconductor element 20 is flip-chip joined to the wiring substrate 10. In other words, the semiconductor element 20 is electrically coupled to the connecting pads 12 on the wiring substrate 10 by the connection terminals 21. Examples of the connection terminals 21 include a gold (Au) bump and a solder bump. Examples of the material of the solder bump include alloys containing lead (Pb), an alloy of tin (Sn) and copper (Cu), an alloy of Sn and silver (Ag), or an alloy of Sn, Ag, and Cu.

The gap between the lower surface of the semiconductor element 20 and the upper surface of the wiring substrate 10 is filled with an underfill resin 22. Examples of the material of the underfill resin 22 include insulating resins such as epoxy resins.

The radiator plate 30 is arranged on the semiconductor element 20. The radiator plate 30 is also referred to as a heat spreader. Examples of the material of the radiator plate 30 include copper (Cu), aluminum (Al), Cu alloys, or Al alloys.

The radiator plate 30 is joined to the wiring substrate 10. For example, the radiator plate 30 is joined to a peripheral edge of the wiring substrate 10 by a joining member 50 so as to surround the semiconductor element 20. Examples of the material of the joining member 50 include silicon polymer-based resins.

The radiator plate 30 includes a plate-shaped base portion 31, a frame-shaped side wall portion 32, and attachment portions 33. The side wall portion 32 is integrally formed at the periphery of the base portion 31. A bottom surface of the side wall portion 32 is joined to the wiring substrate 10 by the joining member 50. The attachment portions 33 laterally project from the base portion 31. The manufacturing of the radiator plate 30 may be carried out, for example, by forge processing or machine cutting.

The radiator plate 30 includes a recess 35 formed by the base portion 31 and the side wall portion 32. The semiconductor element 20 is accommodated in an accommodating portion surrounded by the recess 35 and the wiring substrate 10. A surface (upper surface as viewed in FIG. 1A) on the opposite side of the element forming surface of the semiconductor element 20 is thermally coupled to an inner bottom surface of the recess 35 of the radiator plate 30 through a thermal interface material (TIM) 51. A planar shape of the base portion 31 of the radiator plate 30 is formed to, for example, a square shape (see FIG. 1B). The size of the base portion 31 is, for example, about 20 mm×20 mm to 40 mm×40 mm when viewed from above. The thickness of the base portion 31 may be, for example, about 0.5 to 4 mm.

The thermal interface material 51 illustrated in FIG. 1A may be formed by molding a higher thermal conductive substance such as indium (In), silicone (or carbon hydride) grease, metal fillers, graphite or the like, for example, with a resin binder to a sheet shape. The thickness of the thermal interface material 51 may be, for example, about 20 to 30 μm.

The attachment portions 33 are used to fix the heat sink 40. The attachment portions 33 are integrally formed with the base portion 31 and include an upper surface formed to be in flush with the upper surface of the base portion 31. The thickness of the attachment portions 33 is the same as or thinner than that of the base portion 31, and may be, for example, about 0.5 to 4 mm. A groove 34 for fixing the heat sink 40 is formed in each of the attachment portions 33. The groove 34 extends through the attachment portion 33 in a thickness direction.

The heat sink 40 is directly fixed to the radiator plate 30. Examples of the material of the heat sink 40 include copper (Cu), aluminum (Al), or an alloy thereof.

The heat sink 40 includes a plate-shaped base portion 41, a plurality of heat radiation fins 42, and attachment portions 43. The heat radiation fins 42 project out upward from an upper surface of the base portion 41. The attachment portions 43 laterally project out from the base portion 41. The manufacturing of the heat sink 40 may be carried out, for example, by forge processing or machine cutting.

The base portion 41 includes a lower surface that surface-contacts the upper surface of the baser portion 31 of the radiator plate 30. The heat sink 40 is thereby thermally coupled to the radiator plate 30. A planar shape of the base portion 41 is formed to a square shape, for example, the same as the base portion 31. The size of the base portion 41 is set to, for example, the same size as the base portion 31. The size of the base portion 41 thus may be about 20 mm×20 mm to 40 mm×40 mm when viewed from above. The thickness of the base portion 41 is, for example, about 0.3 to 3 mm.

The heat radiation fins 42 are arranged in parallel with a given interval over substantially the entire area of the upper surface of the base portion 41. Each heat radiation fin 42 is formed to a shape that realizes a wide surface area so that heat may be easily diffused. In other words, each heat radiation fin 42 extends in a direction (upward in FIG. 1A) away from the semiconductor element 20. The heat radiation fins 42 are integrally formed with the base portion 41.

The attachment portions 43 are used to fix the heat sink 40 to the radiator plate 30. The attachment portions 43 are integrally formed with the base portion 41 and include a lower surface formed to be in flush with the lower surface of the base portion 41. The thickness of the attachment portions 43 is the same as or thinner than the base portion 41, and may be about 0.2 to 3 mm, for example. A cylindrical projection 44 projects out downward from the lower surface of each of the attachment portions 43. Each projection 44 is inserted to the groove 34 formed in a corresponding one of the attachment portions 33 of the radiator plate 30. For example, each projection 44 is inserted to the corresponding groove 34 in a state in which the side surface of the projection 44 comes into contact with the side wall of the groove 34. The projections 44 project out downward than the attachment portions 33. The projections 44 are fitted and inserted to the respective grooves 34 when the heat sink 40 is fixed to the radiator plate 30. Each projection 44 may be integrally formed with the attachment portion 43, but a member manufactured separate from the attachment portion 43 may be joined to the attachment portion 43 as the projection 44. When the projections 44 are manufactured separate from the attachment portions 43, the material of the projections 44 may be, for example, copper, aluminum, iron (Fe), stainless steel, alloy thereof, or the like.

In the semiconductor device 1 having the above structure, the heat generated from the semiconductor element 20 is once diffused to the radiator plate 30 through the thermal interface material 51, and then conducted to the heat sink 40 having a wide surface area. The heat is then radiated to the atmosphere from the heat sink 40. Accordingly, the heat generated from the semiconductor element 20 is efficiently radiated. This suppresses the temperature rise of the semiconductor element 20.

An attachment structure of the radiator plate 30 and the heat sink 40 will now be described below.

Figure 1B:
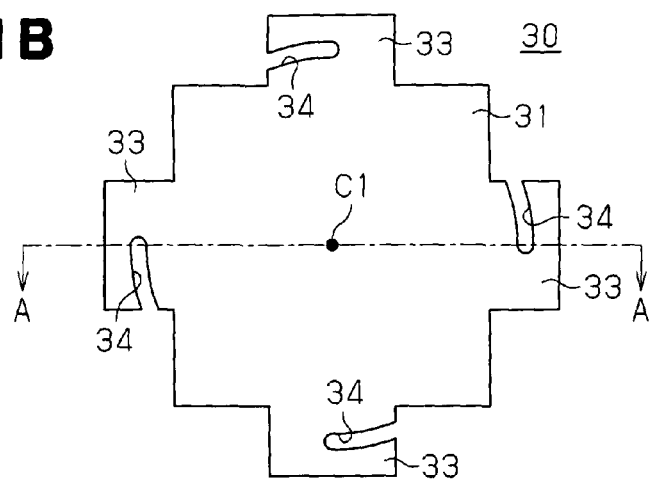
FIG. 1B is a schematic plan view illustrating a radiator plate arranged in the semiconductor device of FIG. 1A.

As illustrated in FIG. 1B, each attachment portion 33 of the radiator plate 30 is formed near the center of each side of the base portion 31. In other words, the base portion 31 includes four attachment portions 33. The planar shape of each attachment portion 33 is a rectangular shape, for example. The groove 34 is formed in each attachment portion 33, and extends from one side surface of the attachment portion 33 to the middle on the inner side. In other words, the groove 34 has an open end and a closed end (terminating end). The groove 34 has a width that is set to substantially the same length as the diameter of the projection 44. For example, the width of the groove 34 is set so that the projection 44 is movable in the groove 34 while the side surface of the projection 44 contacts the side wall of the groove 34. The attachment portions 33 and the grooves 34 are arranged on a circumference of a concentric circle with respect to a center point C1 of the radiator plate 30 (center point of the base portion 31) when the radiator plate 30 is viewed from above. For example, the attachment portions 33 and the grooves 34 are arranged to be point-symmetric with respect to the center point C1 of the radiator plate 30 when viewed from above.

Figure 1C:
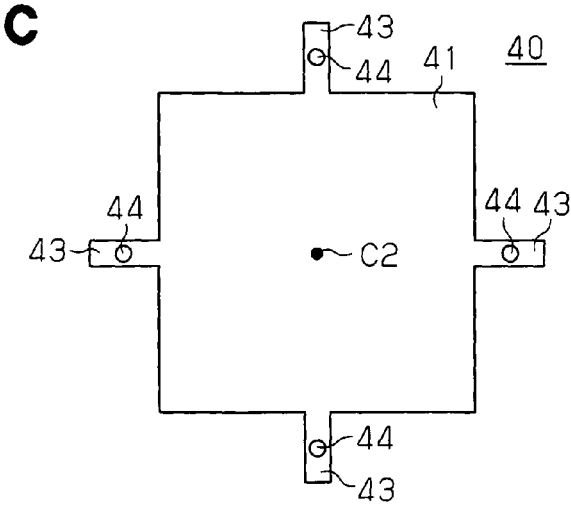
FIG. 1C is a schematic plan view illustrating a heat sink arranged in the semiconductor device of FIG. 1A.
Figure 2A:
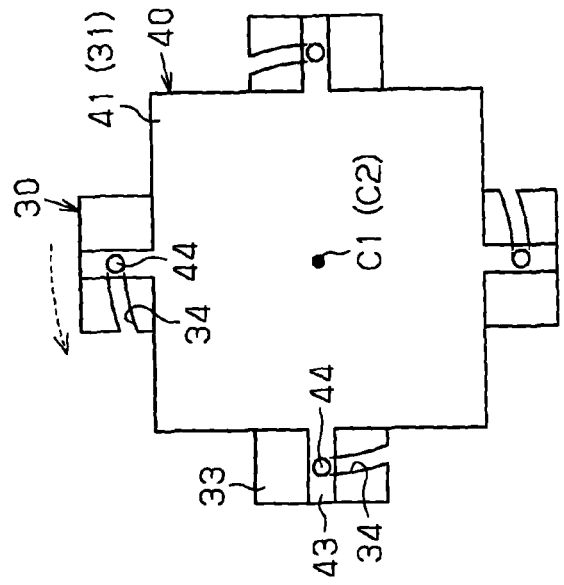
FIGS. 2A and 2B are explanatory diagrams illustrating an attachment method of the heat sink.
Figure 2B:
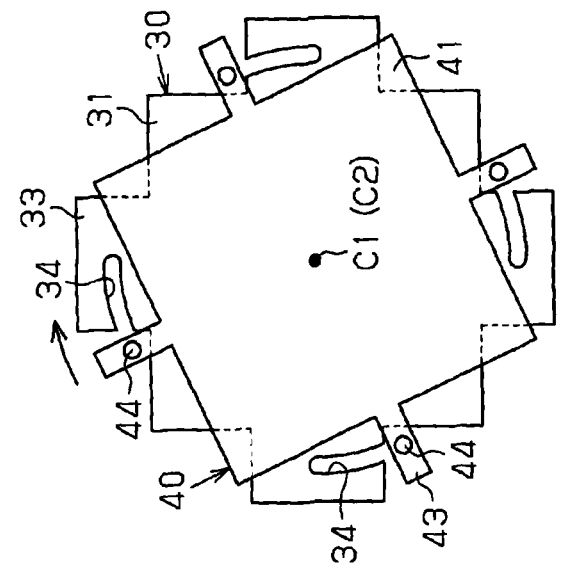

As illustrated in FIG. 1C, each attachment portion 43 of the heat sink 40 is formed near the center of each side of the base portion 41. In other words, the base portion 41 includes four attachment portions 43. For example, the planar shape of each attachment portion 43 is a rectangular shape, and is formed smaller than the planar shape of the attachment portion 33. The cylindrical projection 44 is formed on each attachment portion 43. The attachment portions 43 and the grooves 44 are arranged on a circumference of a concentric circle with respect to a center point C2 of the heat sink 40 (center point of the base portion 41) when the heat sink 40 is viewed from above. For example, the attachment portions 43 and the grooves 44 are arranged to be point-symmetric with respect to the center point C2 of the heat sink 40 when viewed from above. In FIGS. 1C, 2A, and 2B, the projections 44 are illustrated with a solid line to clarify the positional relationship of the grooves 34 and the projections 44.

The effects of the semiconductor device 1 will now be described below along with the attachment method of the heat sink 40 to the radiator plate 30.

First, as illustrated in FIG. 2A, the center point C1 of the radiator plate 30 and the center point C2 of the heat sink 40 are coincided, and the heat sink 40 is mounted on the upper surface of the radiator plate 30 at the position the projections 44 do not interfere with the attachment portions 33. Here, the lower surface of the heat sink 40 comes into contact with the upper surface of the radiator plate 30. The heat sink 40 is then rotated about the center point C2 in the direction of the arrow in FIG. 2A to move each projection 44 towards the open end of each groove 34. Each projection 44 then enters the groove 34 from the open end, and moves (rotates) while making contact with the side wall of the groove 34. In other words, the groove 34 is formed along a movement path of the projection 44 when the center points C1 and C2 are coincided and the heat sink 40 is rotated in the direction of the arrow. As illustrated in FIG. 2B, when each projection 44 comes into contact with the closed end (terminating end) of the corresponding groove 34, each projection 44 is fitted into the terminating end of the groove 34. In this case, the movement of the projection 44 in the entering direction (see solid line arrow in FIG. 2A) is regulated by the side wall forming the terminating end of the groove 34. The movement of each projection 44 in the up and down direction and the movement in the direction (see broken line arrow) opposite to the entering direction are regulated by the friction force between the side surface of the projection 44 and the side wall of the groove 34. Thus, the heat sink 40 is fixed to the radiator plate 30 through a simple operation of rotating the heat sink 40 in a given direction. Accordingly, a special component or a tool for attaching the heat sink 40 to the radiator plate 30 is not necessary.

The semiconductor device 1 of one embodiment has the following advantages.

(1) The heat sink 40 is directly fixed to the radiator plate 30. Thus, the region for fixing the heat sink 40 to the mounting substrate such as the motherboard does not need to be ensured. The semiconductor device 1 is thus miniaturized. Further, the contacting state of the heat sink 40 and the radiator plate 30 is not affected by the warp of the motherboard. Therefore, the radiator plate 30 and the hat sink 40 are suitably brought into surface-contact even if warp occurred in the mounting substrate such as the motherboard. A wide contacting area of the radiator plate 30 and the heat sink 40 is thus ensured, so that heat is efficiently conducted from the radiator plate 30 to the heat sink 40. As a result, the heat generated from the semiconductor element 20 is efficiently radiated. This suitably suppresses the temperature rise of the semiconductor element 20.

(2) The heat sink 40 is attached to the radiator plate 30 through a simple operation of rotating the heat sink 40 in a given direction. Thus, a special component or a tool for attaching the heat sink 40 to the radiator plate 30 is not necessary. Therefore, the manufacturing steps are simplified.

It should be apparent to those skilled in the art that the aforementioned embodiment may be embodied in many other specific forms without departing from the spirit or scope of the invention. Particularly, it should be understood that the invention may be embodied in the following forms.

Figure 3A:
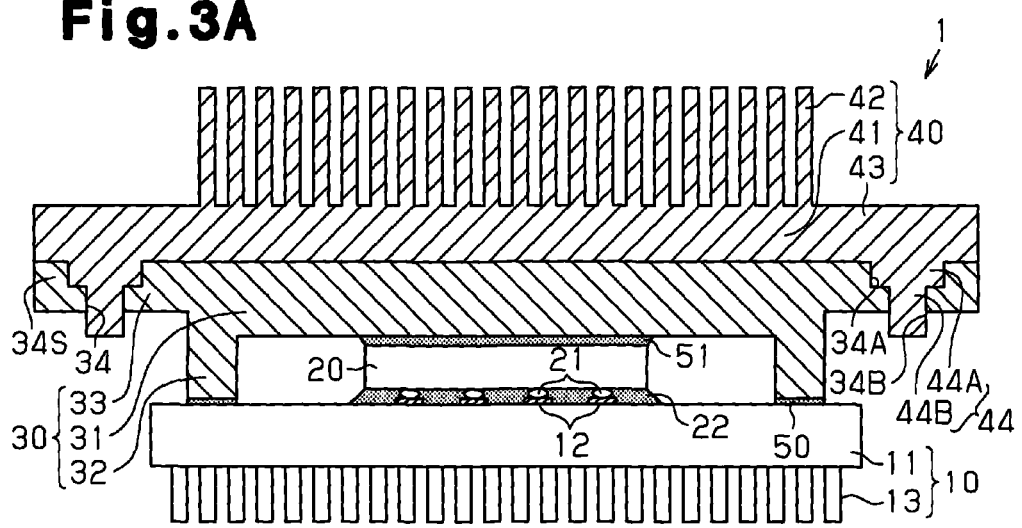
FIG. 3A is a schematic cross-sectional view illustrating a modified example of the semiconductor device of FIG. 1A.
Figure 3B:
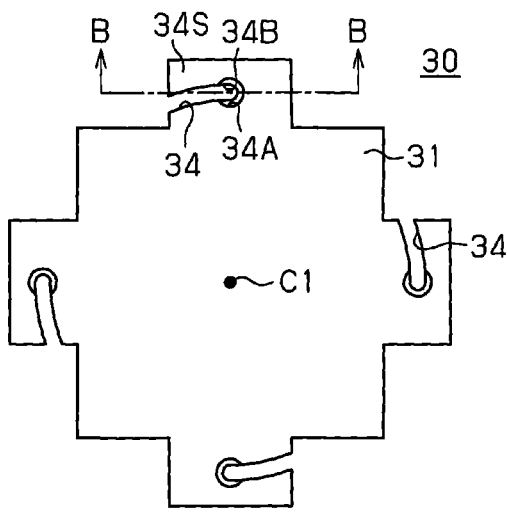
FIG. 3B is a schematic plan view illustrating a radiator plate arranged in the semiconductor device of FIG. 3A.
Figure 3C:
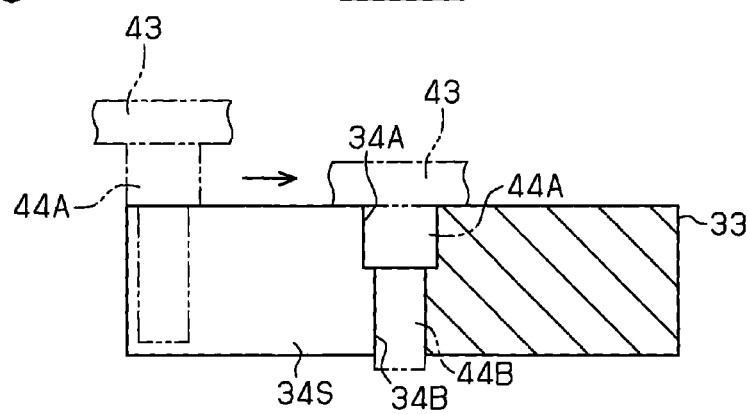
FIG. 3C is a schematic cross-sectional view taken along line B-B of the radiator plate of FIG. 3B.

As illustrated in FIG. 3A, the shape of the projection 44 of the heat sink 40 may be changed to have a T-shaped cross-section. For example, the projection 44 includes a first projection 44A formed on the lower surface of the attachment portion 43 and a second projection 44B formed on a lower surface of the first projection 44A and having a narrower width (smaller diameter) than the first projection 44A. In such a structure, a recess 34A to which the first projection 44A is fitted may be formed in a side wall 34S of the groove 34 at the terminating end thereof, as illustrated in FIGS. 3B and 3C. An opening diameter of the recess 34A is substantially the same as the diameter of the first projection 44A, and the depth of the recess 34A is substantially the same as the thickness of the first projection 44A. FIG. 3A illustrates a cross-sectional structure at the terminating end of the groove 34, and a state in which the first projection 44A is fitted into the recess 34A is illustrated. As illustrated in FIG. 3A, a groove 34B is formed on a lower side of the recess 34A at the terminating end of the groove 34. The second projection 44B is fitted and inserted to the groove 34B (that is, the terminating end of the groove 34). The width of the groove 34 has a dimension shorter than the diameter of the first projection 44A other than at the terminating end, and is set to substantially the same length as the diameter of the second projection 44B. Thus, as illustrated in FIG. 3C, when the first projection 44A reaches the terminating end of the groove 34, the first projection 44A is fitted to the recess 34A, and the second projection 44B is fitted and inserted to the groove 34B. Therefore, after the heat sink 40 is attached to the radiator plate 30, the movement of the projection 44 (first projection 44A) is prevented even if an external force that rotates the heat sink 40 is applied. As a result, the heat sink 40 is suitably suppressed from detaching from the radiator plate 30.

Figure 4:
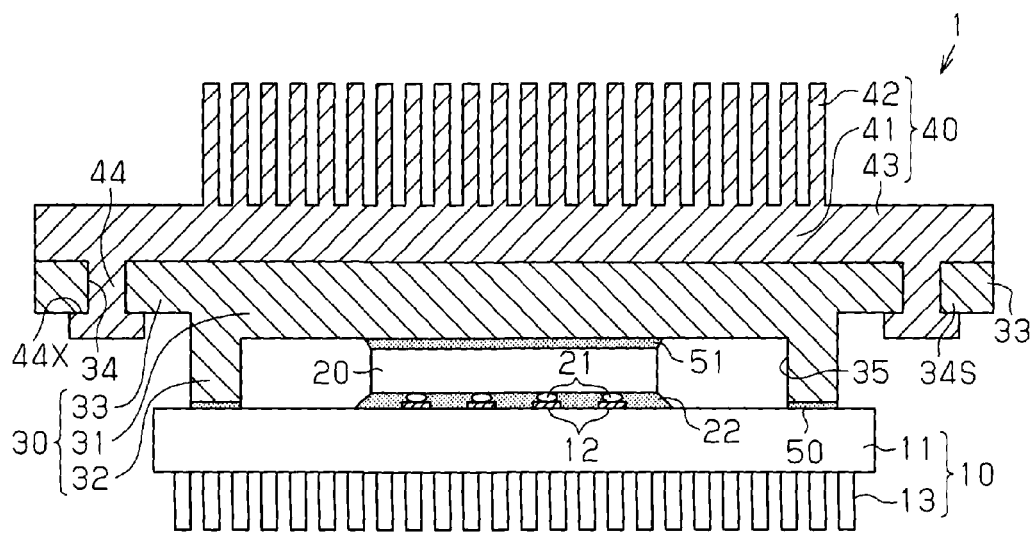
FIG. 4 is a schematic cross-sectional view illustrating a modified example of the semiconductor device of FIG. 1A.

As illustrated in FIG. 4, a recess 44X to which the side wall 34S of the groove 34 is fitted may be formed on the side surface of the projection 44. The movement of the projection 44 in the up and down direction is thereby regulated, so that the heat sink 40 is suitably suppressed from detaching from the radiator plate 30.

Figure 5:
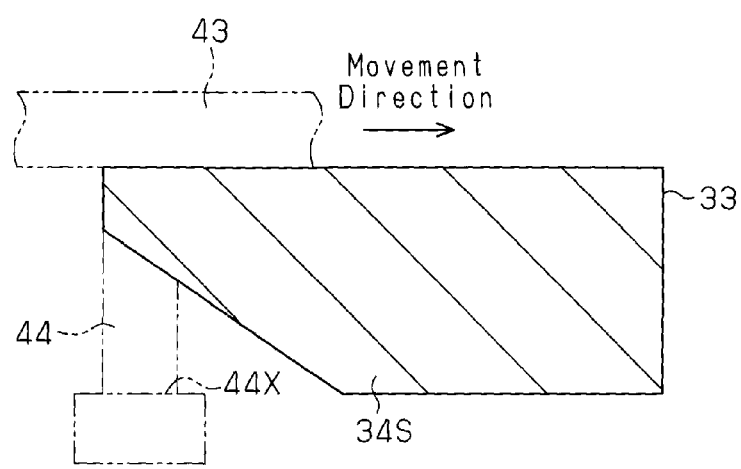
FIG. 5 is a schematic cross-sectional view illustrating a modified example of the radiator plate arranged in the semiconductor device of FIG. 4.

Furthermore, as illustrated in FIG. 5, the side wall 34S of the groove 34 may be formed so as to become thicker from the opening end towards the terminating end. In this case, the side wall 34S of the groove 34 is more securely fitted to the recess 44X of the projection 44 as the projection 44 moves towards the terminating end of the groove 34. The adhesion force of the heat sink 40 and the radiator plate 30 thus may be enhanced. As a result, the heat may be efficiently conducted from the radiator plate 30 to the heat sink 40. In this case, the side wall 34S of the groove 34 forming the terminating end is preferably set to a thickness the side wall 34S is fitted to the recess 44X of the projection 44.

Figure 6:
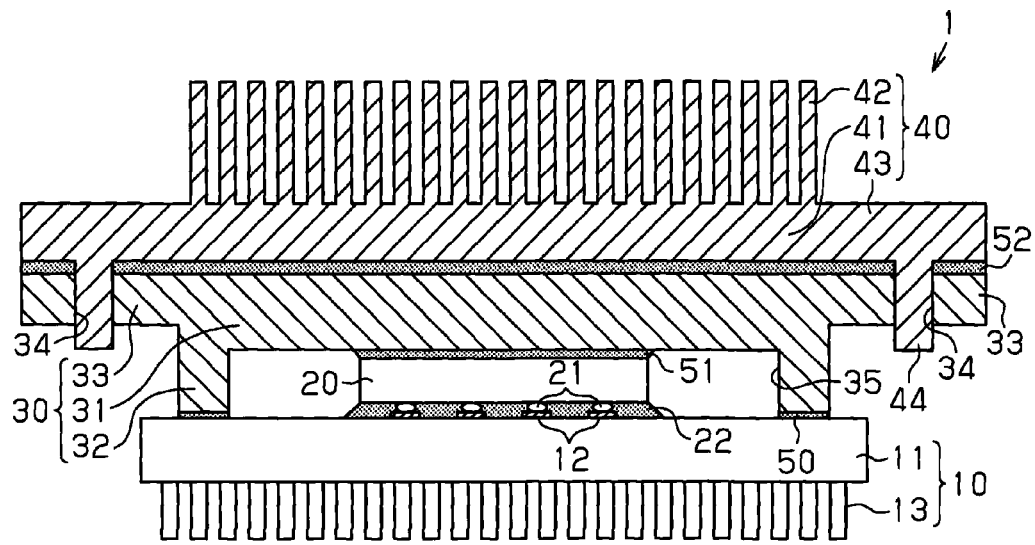
FIG. 6 is a schematic cross-sectional view illustrating a modified example of the semiconductor device of FIG. 1A.

As illustrated in FIG. 6, a heat conduction member 52 may be interposed between the radiator plate 30 and the heat sink 40. In other words, the radiator plate 30 and the heat sink 40 may be thermally coupled through the thermal interface material 52. The thermal interface material 52 may be formed by molding a higher thermal conductive substance such as indium, silicone (or carbon hydride) grease, metal fillers, graphite or the like, for example, with a resin binder to a sheet shape. The thickness of the heat conduction member 52 may be about 20 to 30 μm, for example.

Figure 7:
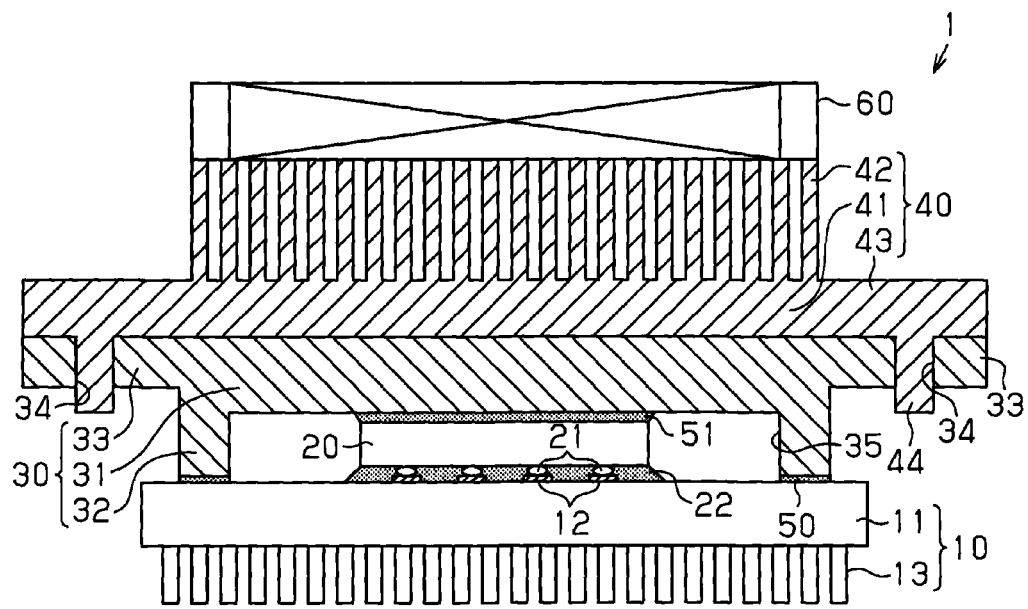
FIG. 7 is a schematic cross-sectional view illustrating a modified example of the semiconductor device of FIG. 1A.

As illustrated in FIG. 7, a fan 60 may be arranged at the upper part of the heat sink 40. In this case, the moving amount of air is forcibly increased by the fan 60, thus enhancing the cooling performance.

Figure 8A:
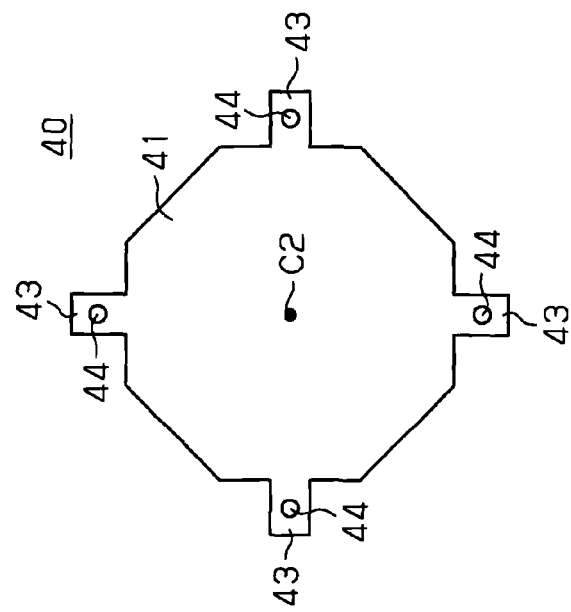
FIG. 8A is a schematic plan view illustrating a modified example of the radiator plate arranged in the semiconductor device of FIG. 1A.
Figure 8B:
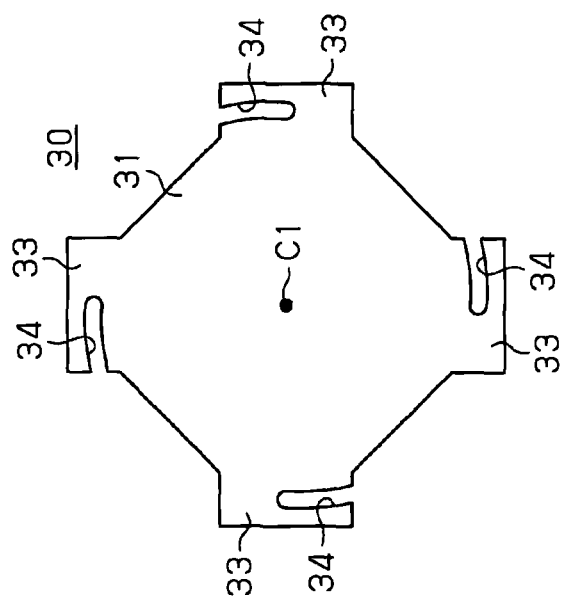
FIG. 8B is a schematic plan view illustrating a modified example of the heat sink arranged in the semiconductor device of FIG. 1A.

In the embodiment described above, the base portion 31 of the radiator plate 30 and the base portion 41 of the heat sink 40 have a square planar shape. However, the planar shape of the base portions 31 and 41 may be polygonal shape such as a rectangle or an octagon, or a circular shape, for example. FIGS. 8A and 8B illustrate an example in which the planar shapes of the base portions 31 and 41 are formed to an octagonal shape. In this case as well, the attachment portions 33 (grooves 34) are formed in a positional relationship that become point-symmetric with respect to the center point C1 of the radiator plate 30 when the radiator plate 30 is viewed from above. Similarly, the attachment portions 43 (projections 44) are formed in a positional relationship that become point-symmetric with respect to the center point C2 of the heat sink 40 when the heat sink 40 is viewed from above. This structure also has advantages similar to the embodiment described above.

In the embodiment described above, the radiator plate 30 includes the attachment portions 33 with the grooves 34, and the heat sink 40 includes the attachment portions 43 with the projections 44. However, for example, the radiator plate 30 may include the attachment portions 43 with the projections 44, and the heat sink 40 may include the attachment portions 33 with the grooves 34.

Figure 9B:
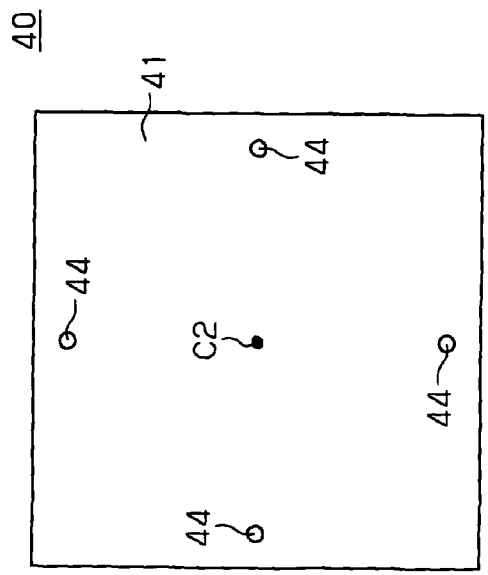
FIG. 9B is a schematic plan view illustrating a modified example of the heat sink arranged in the semiconductor device of FIG. 1A.
Figure 9A:
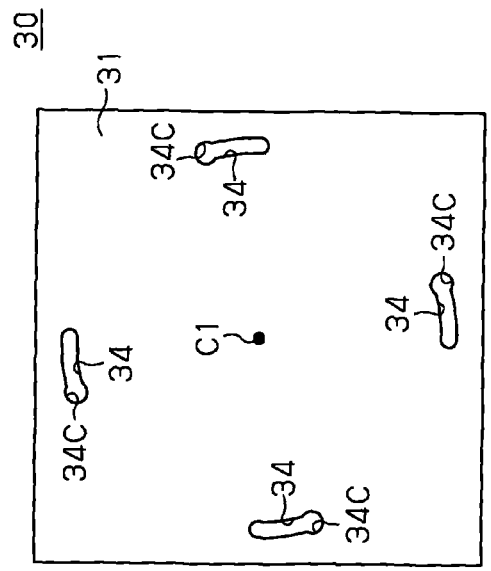
FIG. 9A is a schematic plan view illustrating a modified example of the radiator plate arranged in the semiconductor device of FIG. 1A.
Figure 11:
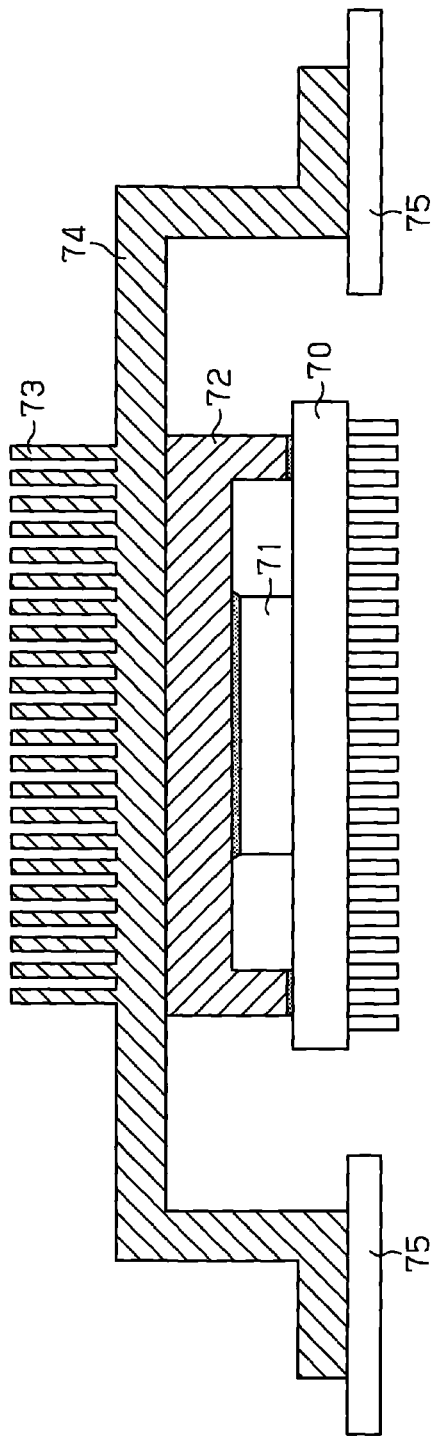
FIG. 11 is a schematic cross-sectional view illustrating a semiconductor device of the related art.

In the embodiment described above, the radiator plate 30 includes the attachment portions 33 with the grooves 34, and the heat sink 40 includes the attachment portions 43 with the projections 44, but the attachment portions 33 and 43 may be omitted. For example, as illustrated in FIGS. 9A and 9B, the grooves 34 may be formed in the base portion 31 of the radiator plate 30. In this case, the projections 44 may be formed in the base portion 41 of the heat sink 40. The width of the groove 34 is preferably widened at a position 34C where the projection 44 is to be inserted. In this case as well, the grooves 34 are formed in a positional relationship that become point-symmetric with respect to the center point C1 of the radiator plate 30 when the radiator plate 30 is viewed from above. Similarly, the projections 44 are formed in a positional relationship that become point-symmetric with respect to the center point C2 of the heat sink 40 when the heat sink 40 is viewed from above. This structure also has advantages similar to the embodiment described above.

In the embodiment described above and each modified example described above, the grooves 34 and the projections 44 are formed in a positional relationship that become point-symmetric with respect to the center points C1 and C2, respectively. However, for example, the grooves 34 (attachment portions 33) may not be formed in the positional relationship that become point-symmetric with respect to the center point C1 as long as they are formed on the circumference of a concentric circle with respect to the center point C1 of the radiator plate 30, as illustrated in FIG. 10A. Furthermore, for example, the projections 44 (attachment portions 43) may not be formed in the positional relationship that become point-symmetric with respect to the center point C2 as long as they are formed on the circumference of a concentric circle with respect to the center point C2 of the heat sink 40, as illustrated in FIG. 10B. In this case as well, advantages similar to the embodiment described above are obtained.

In the embodiment described above, the heat sink 40 is rotated when attaching the heat sink 40 to the radiator plate 30, but the radiator plate 30 may be rotated or both the heat sink 40 and the radiator plate 30 may be rotated. Further, the heat sink 40 may be attached to the radiator plate 30, and then the radiator plate 30 and the heat sink 40 may be joined to the wiring substrate 10.

The heat radiation fins 42 in the embodiment described above may be omitted. In other words, the heat sink that does not have the heat radiation fins may be attached to the radiator plate 30 instead of the heat sink 40.

In the embodiment described above, the projection 44 is formed to a circular column shape, but the projection 44 may be formed to a quadratic prism shape, for example.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
    a wiring substrate;
    a semiconductor element mounted on the wiring substrate;
    a first radiator member arranged on the semiconductor element and thermally coupled to the semiconductor element; and
    a second radiator member arranged on the first radiator member and thermally coupled to the first radiator member; wherein
    the second radiator member includes a plurality of projections which project out toward the first radiator member, the plurality of projections being formed on a circumference of a concentric circle with respect to a center point of the second radiator member when the second radiator member is viewed from above;
    the first radiator member includes a plurality of grooves in which the plurality of projections are movable, the plurality of grooves being formed on a circumference of a concentric circle with respect to a center point of the first radiator member when the first radiator member is viewed from above, each of the plurality of grooves including a terminating end; and
    each of the plurality of projections is fitted to the terminating end of a corresponding one of the plurality of grooves with the center point of the first radiator member and the center point of the second radiator member coincided.

2. The semiconductor device according to claim 1, wherein each of the plurality of projections includes,
    a first projection which projects out from the second radiator member, and
    a second projection which projects out from the first projection and which has a narrower width than the first projection, and
    each of the plurality of grooves includes a recess formed at the terminating end, wherein the first projection is fitted to the recess of the terminating end.

3. The semiconductor device according to claim 1, wherein each of the plurality of projections includes a recess to which a side wall of a corresponding one of the plurality of grooves is fitted.

4. The semiconductor device according to claim 3, wherein the side wall of each of the plurality of grooves is formed to be thicker towards the terminating end.

5. The semiconductor device according to claim 1, wherein
    the second radiator member includes an attachment portion having the plurality of projections, and
    the first radiator member includes an attachment portion having the plurality of grooves.

6. The semiconductor device according to claim 1, wherein
    the plurality of projections are formed at positions point-symmetric with respect to the center point of the second radiator member when the second radiator member is viewed from above, and
    the plurality of grooves are formed at positions point-symmetric with respect to the center point of the first radiator member when the first radiator member is viewed from above.

7. The semiconductor device according to claim 1, wherein the second radiator member includes a plurality of heat radiation fins extending in a direction away from the semiconductor element.

8. The semiconductor device according to claim 1, wherein the plurality of grooves have a length that enables at least one of the first radiator member and the second radiator member to rotate along the grooves.

9. The semiconductor device according to claim 1, wherein each of the plurality of grooves includes an open end and a closed end serving as the terminating end.

10. A semiconductor device comprising:
    a wiring substrate;
    a semiconductor element mounted on the wiring substrate;
    a first radiator member arranged on the semiconductor element and thermally coupled to the semiconductor element; and
    a second radiator member arranged on the first radiator member and thermally coupled to the first radiator member; wherein
    the first radiator member includes a plurality of projections which project out toward the second radiator member, the plurality of projections being formed on a circumference of a concentric circle with respect to a center point of the first radiator member when the first radiator member is viewed from above;
    the second radiator member includes a plurality of grooves in which the plurality of projections are movable, the plurality of grooves being formed on a circumference of a concentric circle with respect to a center point of the second radiator member when the second radiator member is viewed from above, each of the plurality of grooves including a terminating end; and
    each of the plurality of projections is fitted to the terminating end of a corresponding one of the plurality of grooves with the center point of the first radiator member and the center point of the second radiator member coincided.

* * * * *